US009250288B2

(12) United States Patent
Chan et al.

(10) Patent No.: US 9,250,288 B2
(45) Date of Patent: Feb. 2, 2016

(54) WAFER-LEVEL TESTING METHOD FOR SINGULATED 3D-STACKED CHIP CUBES

(71) Applicant: POWERTECH TECHNOLOGY INC., Hsinchu (TW)

(72) Inventors: Kun-Chih Chan, Hsinchu (TW); Shin-Kung Chen, Hsinchu (TW); Sheng-Chi Lin, Hsinchu (TW)

(73) Assignee: POWERTECH TECHNOLOGY INC., Hsinchu (TW)

( * ) Notice: Subject to any disclaimer, the term of this patent is extended or adjusted under 35 U.S.C. 154(b) by 392 days.

(21) Appl. No.: 14/018,697

(22) Filed: Sep. 5, 2013

(65) Prior Publication Data

US 2015/0061718 A1 Mar. 5, 2015

(51) Int. Cl.
*G01R 31/28* (2006.01)
(52) U.S. Cl.
CPC .................................. *G01R 31/2886* (2013.01)
(58) Field of Classification Search
None
See application file for complete search history.

(56) References Cited

U.S. PATENT DOCUMENTS

| | | | |
|---|---|---|---|
| 6,448,661 B1 | 9/2002 | Kim et al. | |
| 6,916,725 B2 | 7/2005 | Yamaguchi | |
| 7,151,009 B2 | 12/2006 | Kim et al. | |
| 2007/0023121 A1* | 2/2007 | Jones | H01L 22/20 156/64 |
| 2014/0051189 A1* | 2/2014 | Kai-Jun | H01L 22/14 438/15 |

OTHER PUBLICATIONS

Marinissen et al., Testing 3D Chips Containing Through-Silicon Vias, 2009, IEEE, International Test Conference, pp. 1-11.*
Watanabe et al., Development of a Chip Prober for Pre-Bond Testing of a 3D-IC, 2013, IEEE Conference, pp. 1-4.*

* cited by examiner

*Primary Examiner* — Melissa Koval
*Assistant Examiner* — Courtney McDonnough
(74) *Attorney, Agent, or Firm* — Muncy, Geissler, Olds & Lowe, P.C.

(57) ABSTRACT

Disclosed is a wafer level testing method for testing a plurality of singulated 3D-stacked chip cubes by utilizing adjustable wafer maps to adjust the pick-and-place positions of the cubes on a carrier wafer. The wafer maps have a plurality of probe-card activated regions each including a plurality of component-attaching regions. Two wafer-level testing steps are performed on the cubes disposed on the carrier wafer according to the wafer maps. By analyzing the electrical testing results of the trial-run wafer-level testing step from the original wafer map, some prone-to-overkill component-attaching regions are confirmed and to create a corrected wafer map which the prone-to-overkill component-attaching regions are excluded from probe-card activated regions. Then, according to the corrected wafer map, cubes are disposed on the carrier wafer without disposing in the prone-to-overkill component-attaching regions. Accordingly, the real-production wafer-level testing step can be run smoothly without unnecessary shut down of adjustment or repair leading to the maximum productivity without overkill issues.

5 Claims, 10 Drawing Sheets

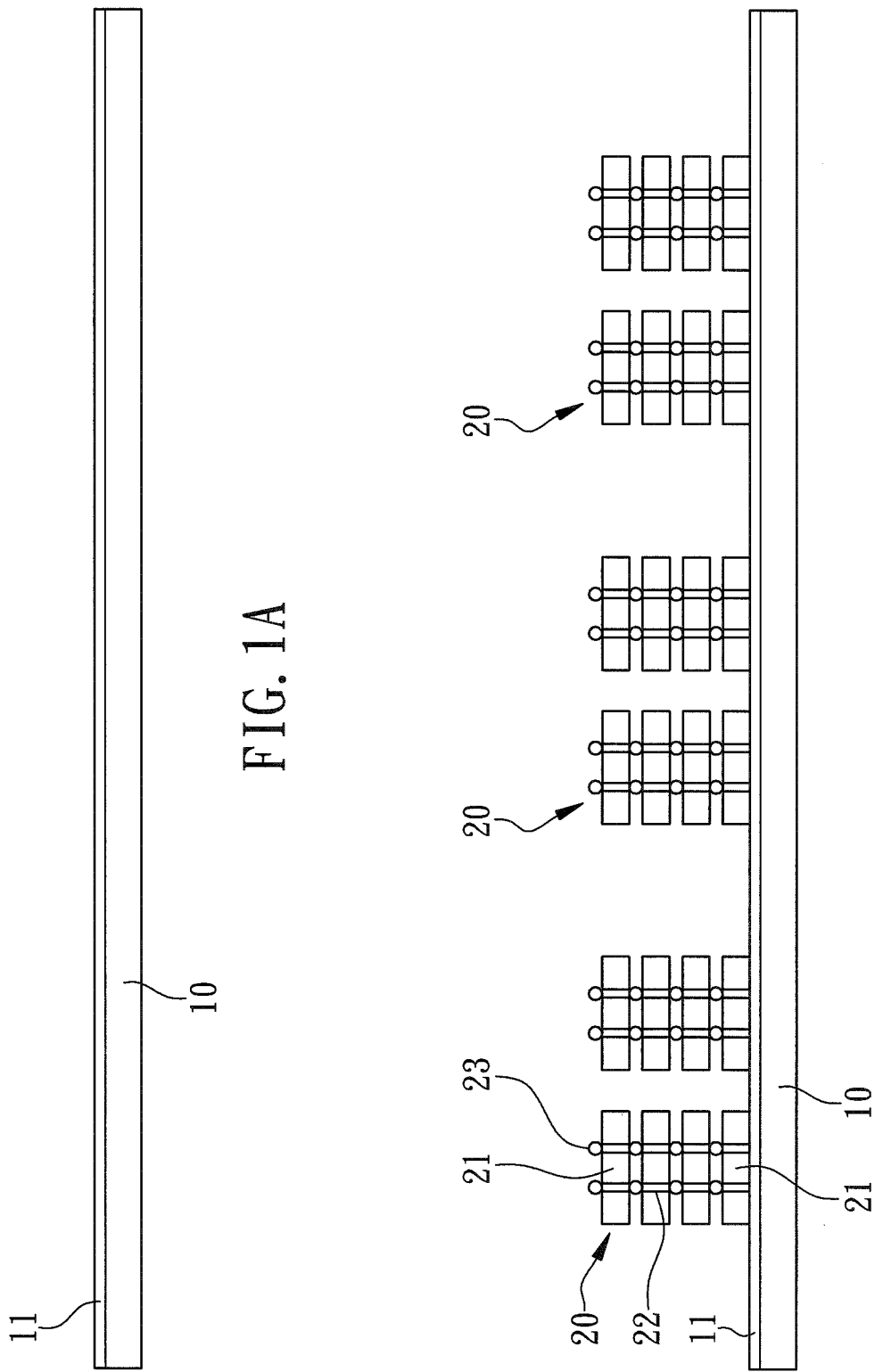

WAFER-LEVEL TESTING METHOD FOR SINGULATED 3D-STACKED CHIP CUBES

FIELD OF THE INVENTION

The present invention relates to an electrical testing method of semiconductor devices and more specifically to a wafer-level testing method for testing a plurality of singulated 3D-stacked chip cubes.

BACKGROUND OF THE INVENTION 3D-stacked chip cubes include vertically stacked multiple chips in a package to achieve chip assemblies with higher density as revealed in U.S. Pat. Nos. 6,448,661, 7,151,009, and 6,916,725. The existing processes are to singulate the chips from wafers first, then vertically stack multiple chips, then followed by package-level electrical testing. However, the pitch of the external micro terminals of the 3D-stacked chip cubes is much smaller than the pitch of conventional semiconductor packages such as smaller than 100 μm which can not be tested by conventional package-level testing tooling and testers for electrical test.

An interposer to test 3D-stacked chip cubes was proposed where 3D-stacked chip cubes were soldering onto an interposer to realize a temporary bonding firstly and followed by electrical testing by package probing at larger-pitch terminals on the interposer. However, the extra cost of an interposer plus the testing cost will be high and the testing results will not be accurate enough due to the interference of the interposer.

Moreover, another electrical testing method was proposed where 3D-stacked chip cubes were disposed on carrier wafers with adhesive to simulate un-singulated chips integrated on a wafer so that 3D-stacked chip cubes could be loaded into a wafer tester to perform wafer-level testing to meet the fine pitch requirements of chip probing. However, "overkill" would be encountered due to disposing tolerance of 3D-stacked chip cubes and the shifting of adhesive which can not align with the probes of a probe cards during chip probing, i.e., some "OK" 3D-stacked chip cubes will be judged as "NG". The only way to overcome "overkill" issues is to frequently stop wafer testers to debug, repair, and maintenance to correct probe card misalignment issues leading to poor testing efficiency and lower productivity.

SUMMARY OF THE INVENTION

The main purpose of the present invention is to provide a wafer-level testing method for singulated 3D-stacked chip cubes to avoid overkill issues during wafer-level testing.

Another purpose of the present invention is to provide a wafer-level testing method for singulated 3D-stacked chip cubes to reduce electrical testing time in prone-to-overkill regions on carrier wafers and to increase testing efficiency during wafer-level testing.

According to the present invention, a wafer-level testing method for singulated 3D-stacked chip cubes is revealed comprising the following steps: firstly, at least one carrier wafer with the same dimension as a regular semiconductor wafer is provided, where the semiconductor wafer is for loading in a wafer tester. A plurality of first 3D-stacked chip cubes are attached onto the carrier wafer according to a first wafer map where the first wafer map defines a plurality of first probe card activating regions. Each first probe card activating region is corresponding to a probe card in the wafer tester and includes a plurality of first component-attaching regions to constitute a M-by-N matrix where each first component-attaching region is one-to-one corresponding to one of the first 3D-stacked chip cubes on the carrier wafer as well as one-to-one corresponding to one of a plurality of component probing units of the probe card. Then, a first wafer-level testing step is proceeded in the wafer tester, including one-by-one wafer-level testing the first 3D-stacked chip cubes disposed in each first probe card activating region by the probe card where the electrical functions of the component probing units are fully activated during the first wafer-level testing processes. Then, a second wafer map is built according to the electrical testing results of the first wafer-level testing so that one or more prone-to-overkill component-attaching regions are confirmed from each first probe card activating region. The second wafer map defines a plurality of second probe card activated regions where each second probe card activated region is corresponding to the probe card in the wafer tester and includes a plurality of second component-attaching regions but not including the above mentioned prone-to-overkill component-attaching regions. The second component-attaching regions in each second probe card activated region are arranged in a same pattern to constitute an incomplete matrix. Then, a plurality of second 3D-stacked chip cubes with the same dimensions as the first 3D-stacked chip cubes are disposed on the carrier wafer where the second 3D-stacked chip cubes are not disposed in the above mentioned prone-to-overkill component-attaching regions of the carrier wafer. Finally, a second wafer-level testing step is proceeded in the wafer tester, including wafer-level testing each second 3D-stacked chip cubes in the second probe card activated regions.

DESCRIPTION OF THE DRAWINGS

FIGS. 1A to 1G are cross-sectional views showing each processing step of the wafer-level testing method for singulated 3D-stacked chip cubes according to the preferred embodiment of the present invention.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

According to the preferred embodiment of the present invention, a wafer-level testing method for singulated 3D-stacked chip cubes is illustrated from FIGS. 1A to 1G showing cross-sectional views during each processing step.

Figure 1C:
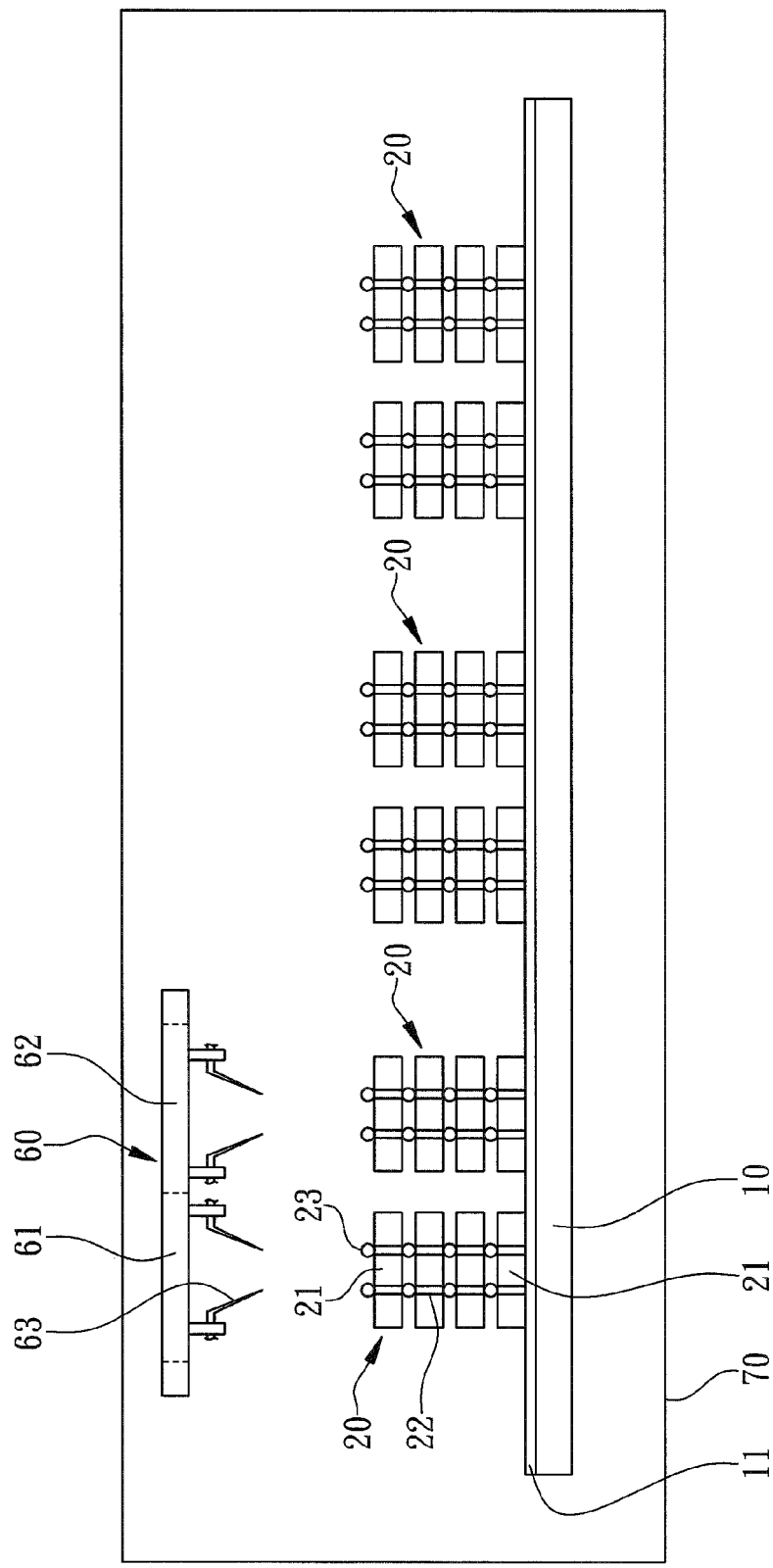
Figure 2:
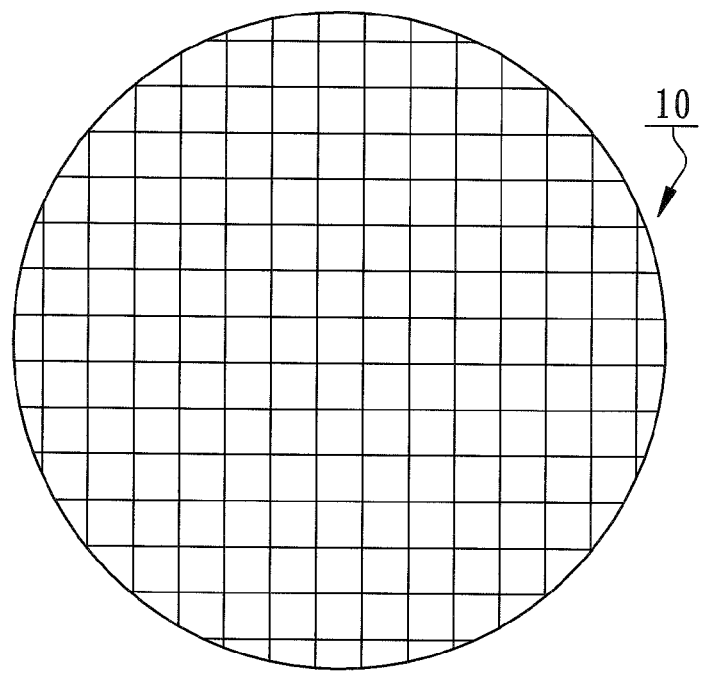
FIG. 2 is a top view showing a carrier wafer of the wafer-level testing method for singulated 3D-stacked chip cubes according to the preferred embodiment of the present invention.

Firstly, as shown in FIG. 1A and FIG. 2, at least a carrier wafer 10 with the same dimension as a regular semiconductor wafer is provided to be a carrier for 3D-stacked chip cubes. The semiconductor wafer can be loaded in a wafer tester for IC testing. The carrier wafer 10 is a stiff circular disc with a specific dimension such as 8", 12", and 18" to simulate semiconductor wafers where the carrier wafer 10 can be loaded into a tester. Normally a temporary adhesive layer 11 is disposed on the surface of the carrier wafer 10 to temporarily adhere singulated 3D-stacked chip cubes where the carrier wafer 10 may be transparent so that the temporary adhesive layer 11 will lose its adhesion by radiating with UV light after wafer-level test. The carrier wafer 10 is a wafer carrier implemented in wafer support system but not a wafer carrier for wafer backside lapping.

Figure 3:
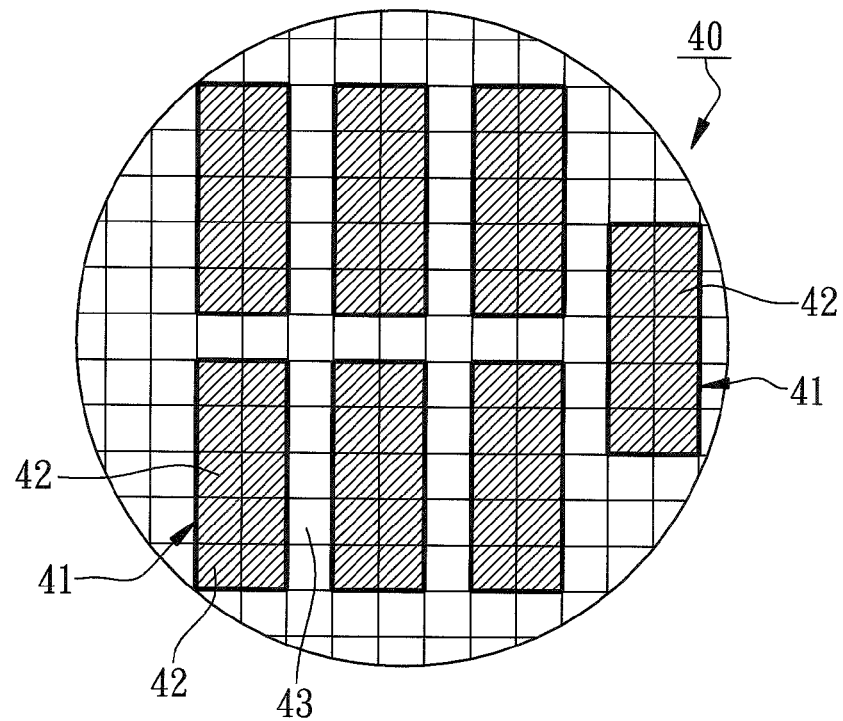
FIG. 3 is a top view showing the first wafer map of the wafer-level testing method for singulated 3D-stacked chip cubes according to the preferred embodiment of the present invention.
Figure 4:
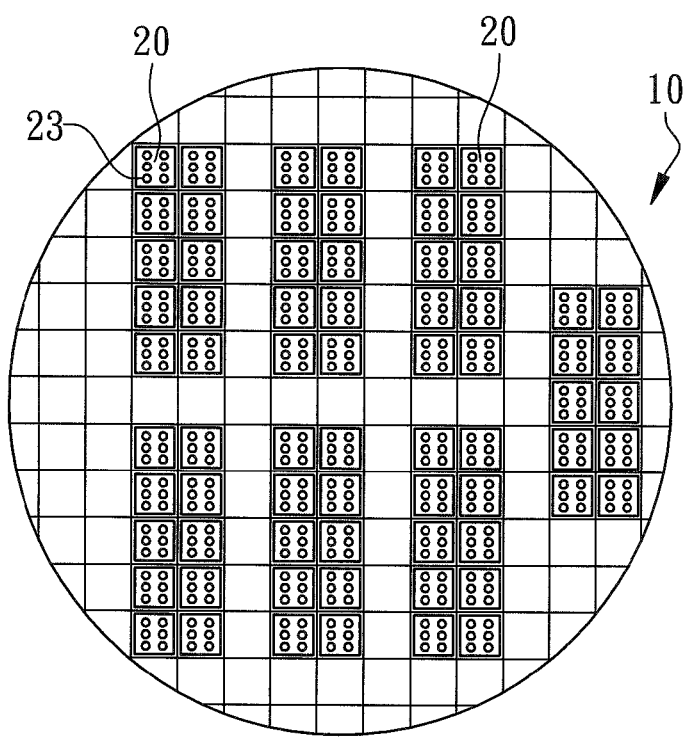
FIG. 4 is a top view showing disposing the first 3D-stacked chip cubes on a carrier wafer according to the first wafer map of the wafer-level testing method for singulated 3D-stacked chip cubes according to the preferred embodiment of the present invention.
Figure 5:
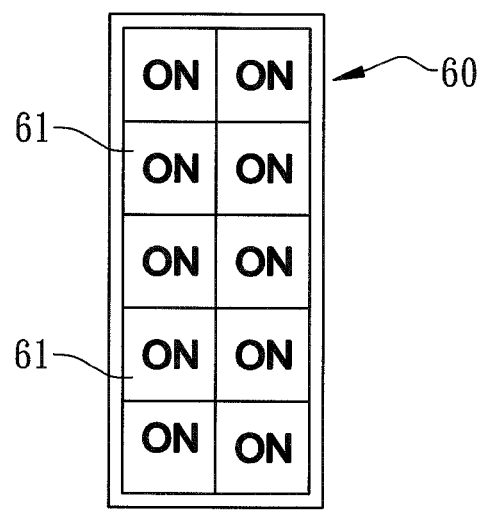
FIG. 5 is an ON-OFF distribution of the probe card of a tester during the first wafer-level testing of the wafer-level testing method for singulated 3D-stacked chip cubes according to the preferred embodiment of the present invention.

As shown in FIG. 1B, FIG. 3, and FIG. 4, a plurality of first 3D-stacked chip cubes 20 are attached onto the carrier wafer 10 by a pick-and-place machine according to a first wafer map 40. The top view of the first wafer map 40 is shown in FIG. 3 and the top view of the first 3D-stacked chip cubes 20 disposed on the carrier wafer 10 according to the first wafer map 40 is shown in FIG. 4. The first wafer map 40 defines a plurality of first probe card activating regions 41 illustrated by M×N assembly of shaded areas such as 2×5 as shown in FIG. 3. Each first probe card activating region 41 is corresponding to a probe card 60 in the wafer tester 70 (as shown in FIG. 1C and FIG. 3) and each first probe card activating region 41 includes a plurality of first component-attaching regions 42 which are illustrated in FIG. 3 where each shaded area represents one first component-attaching region 42 so as to constitute a M-by-N matrix wherein "M" is a positive integer greater than zero, "N" is a positive integer greater than one, for example a 2-by-5 matrix. Each first component-attaching region 42 is one-to-one corresponding to one of the first 3D-stacked chip cubes 20 on the carrier wafer 10 as shown in FIG. 1C and FIG. 4 and each first component-attaching region 42 is one-to-one corresponding to one of a plurality of component probing units 61 of the probe card 60 as shown in FIG. 1C and FIG. 5. The first 3D-stacked chip cubes 20 are temporarily adhered onto the carrier wafer 10 by a temporary adhesive 11. In a preferred embodiment, as shown in FIG. 3 again, at least one row of first non-probing regions 43 are reserved between the first probe card activated regions 41 according to the first wafer map 40 where each of the first non-probing regions 43 has the same unit dimension as each of the first component-attaching regions 42. The first 3D-stacked chip cubes 20 are disposed in the corresponding first component-attaching regions 42 where the probing position of the probe card 60 is corresponding to each first probe card activating region 41 of the first wafer map 40. The first 3D-stacked chip cubes 20 includes a plurality of vertically stacked first chips 21 where the electrical connection between vertically stacked first chips 21 are achieved by a plurality of first TSV 22 fabricated inside the first chips 21 with a plurality of interconnection joints on the surfaces of the first chips 21. A plurality of first micro joints 23 are disposed on the surface of the first 3D-stacked chip cubes 20 away from the carrier wafer 10 to provide probing contacts for the probes 63 of the probe card 60.

Figure 1D:
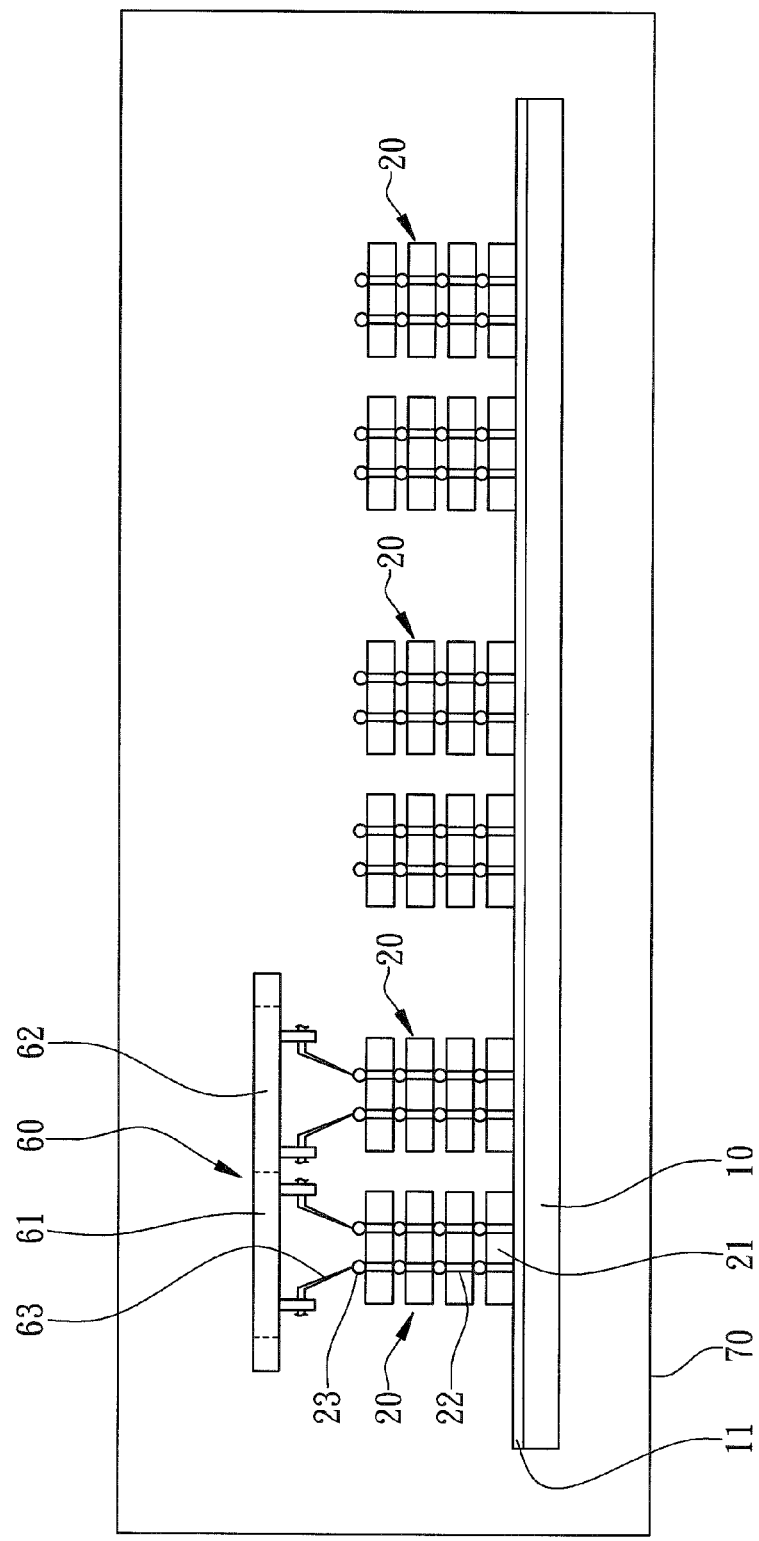

Then, as shown in FIG. 1C and FIG. 1D, a first wafer-level testing is proceeded in the wafer tester 70 after the carrier wafer 10 is loaded into the wafer tester 70. The first wafer-level testing step includes the sub-step of probing the first 3D-stacked chip cubes 20 disposed in each of the first probe card activating regions 41 by the probe card 60 where the electrical functions of the component probing units 61 of the probe card 60 are fully activated as shown in FIG. 5. Each component probing unit 61 of the probe card 60 is aligned to a corresponding first 3D-stacked chip cube 20 where probes 63 of the probe card 60 contact to the corresponding first micro joints 23 of the first 3D-stacked chip cube 20. Then, after unloading the carrier wafer 10, the carrier wafer 10 is radiated by UV light to reduce the adhesion of the temporary adhesive 11 so that the first 3D-stacked chip cubes can easily be picked, placed and sorted.

Figure 6:
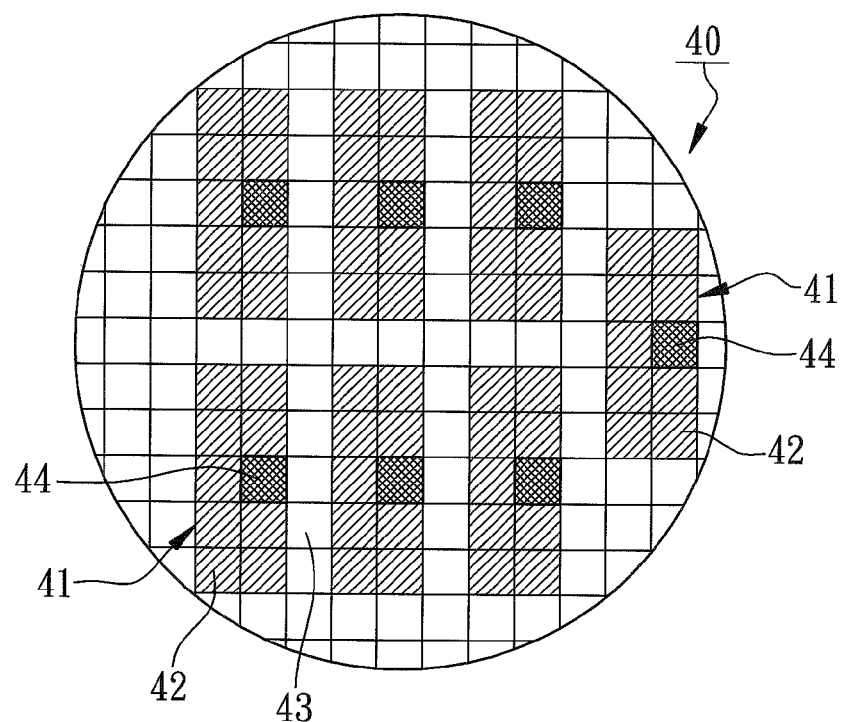
FIG. 6 is an OK/NG distribution of the probe card of a tester during the first wafer-level testing of the wafer-level testing method for singulated 3D-stacked chip cubes according to the preferred embodiment of the present invention.
Figure 7:
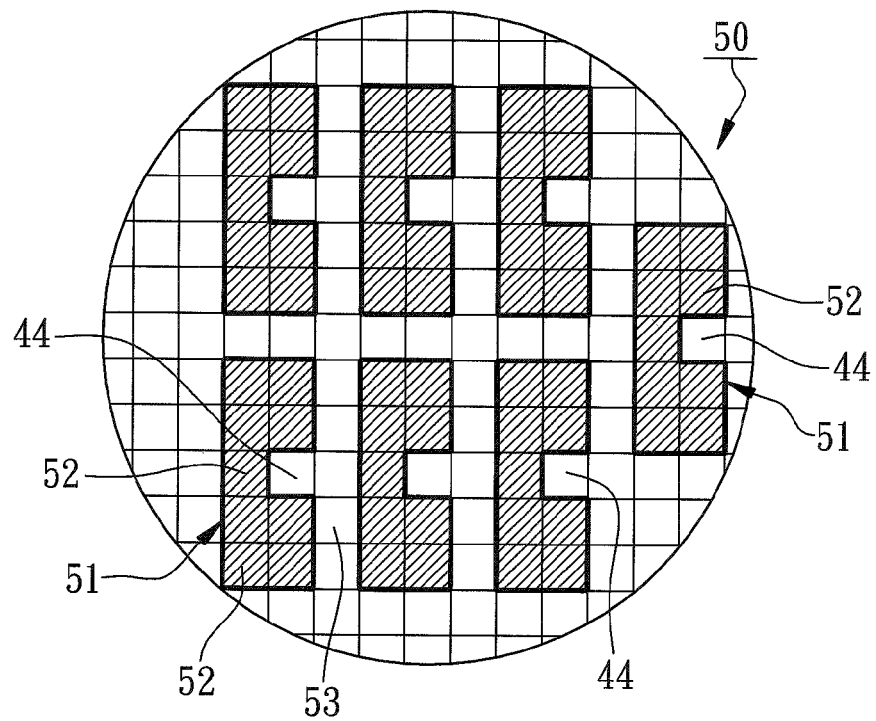
FIG. 7 is a top view showing the second wafer map of the wafer-level testing method for singulated 3D-stacked chip cubes according to the preferred embodiment of the present invention.

Then, as shown in FIG. 6 and FIG. 7, the prone-to-overkill component-attaching regions 44 (illustrated by double shaded area as shown in FIG. 6) are confirmed according to the electrical test results of the first wafer-level testing step to build a second wafer map 50. OK and NG distribution after the first wafer-level testing is illustrated in FIG. 6 so that the prone-to-overkill component probing units 62 which are corresponding to one or more prone-to-overkill component-attaching regions 44 in the specific locations of the component probing units 61 of the probe card 60 can be spot and analyzed. FIG. 7 is the top view of the second wafer map 50 built according to the electrical testing results of the first wafer-level testing. The second wafer map 50 defines a plurality of second probe card activated regions 51. Each second probe card activated regions 51 is corresponding to the probe card 60 and includes a plurality of second component-attaching regions 52 but excluding the above mentioned prone-to-overkill component-attaching regions 44, i.e., the above mentioned prone-to-overkill component-attaching regions 44 are excluded from the second probe card activated regions 51. The second component-attaching regions 52 in each second probe card activated region 51 are arranged in a same pattern to constitute an incomplete matrix. For example, each second probe card activated region 51 is similar to a M×N−P matrix of the shaded area such as 2×5−1. In a preferred embodiment, the second wafer map 50 also reserves at least one row of second non-probing regions 53 between the second probe card activated regions 51 where each of the second non-probing regions 53 has a same unit dimension as each of the second component-attaching regions 52.

Figure 1E:
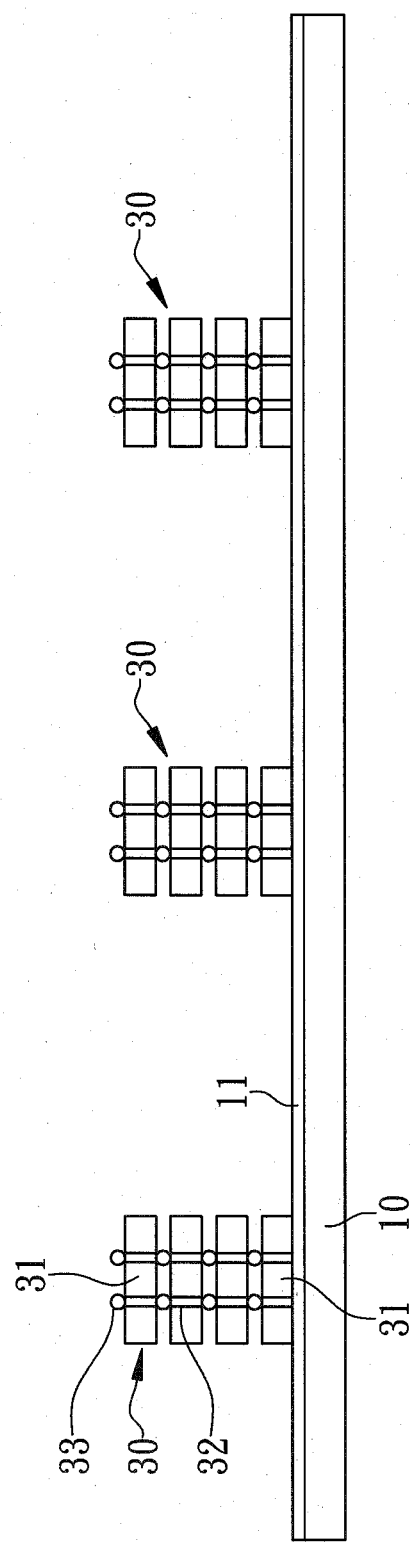
Figure 8:
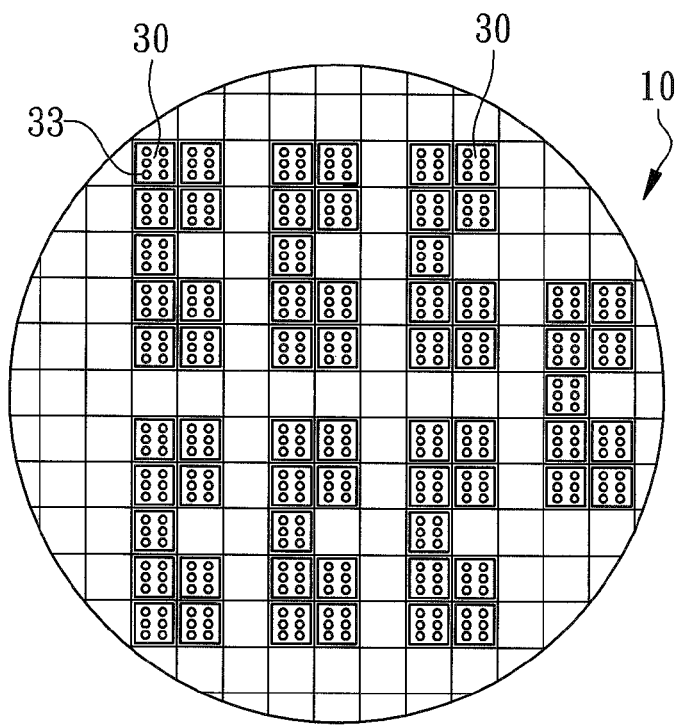
FIG. 8 is a top view showing disposing the second 3D-stacked chip cubes on a carrier wafer according to the second wafer map of the wafer-level testing method for singulated 3D-stacked chip cubes according to the preferred embodiment of the present invention.

Then, as shown in FIG. 1E and FIG. 8, a plurality of second 3D-stacked chip cubes 30 with the same dimension as the first 3D-stacked chip cubes 20 are disposed on the carrier wafer 10 according to the second wafer map 50 where one second 3D-stacked chip cubes 30 is one-to-one corresponding to one second component-attaching region 52 so that the second 3D-stacked chip cubes 30 are not disposed at the above mentioned prone-to-overkill component-attaching regions 44. The carrier wafer 10 for a second wafer-level testing step can be the same carrier wafer or another carrier wafer with the same dimension as the carrier wafer 10 for the first wafer-level testing step. Similar to the first 3D-stacked chip cubes 20, each second 3D-stacked chip cube 30 includes a plurality of vertically stacked second chips 31 where electrical connections between the vertically stacked second chips 31 are achieved by a plurality of TSV 32 fabricated inside the second chips 31 with a plurality of interconnection joints on the surfaces of the second chips 31. A plurality of second micro joints 33 are disposed on one surface of the second 3D-stacked chip cubes 30 away from the carrier wafer 10 for the electrical contact of the probes 63 of the probe card 60.

To be more specific, each first 3D-stacked chip cube 20 can consist of a plurality of known good dice (KGD) and each second 3D-stacked chip cube 30 can consist of a plurality of untested dice.

Figure 1F:
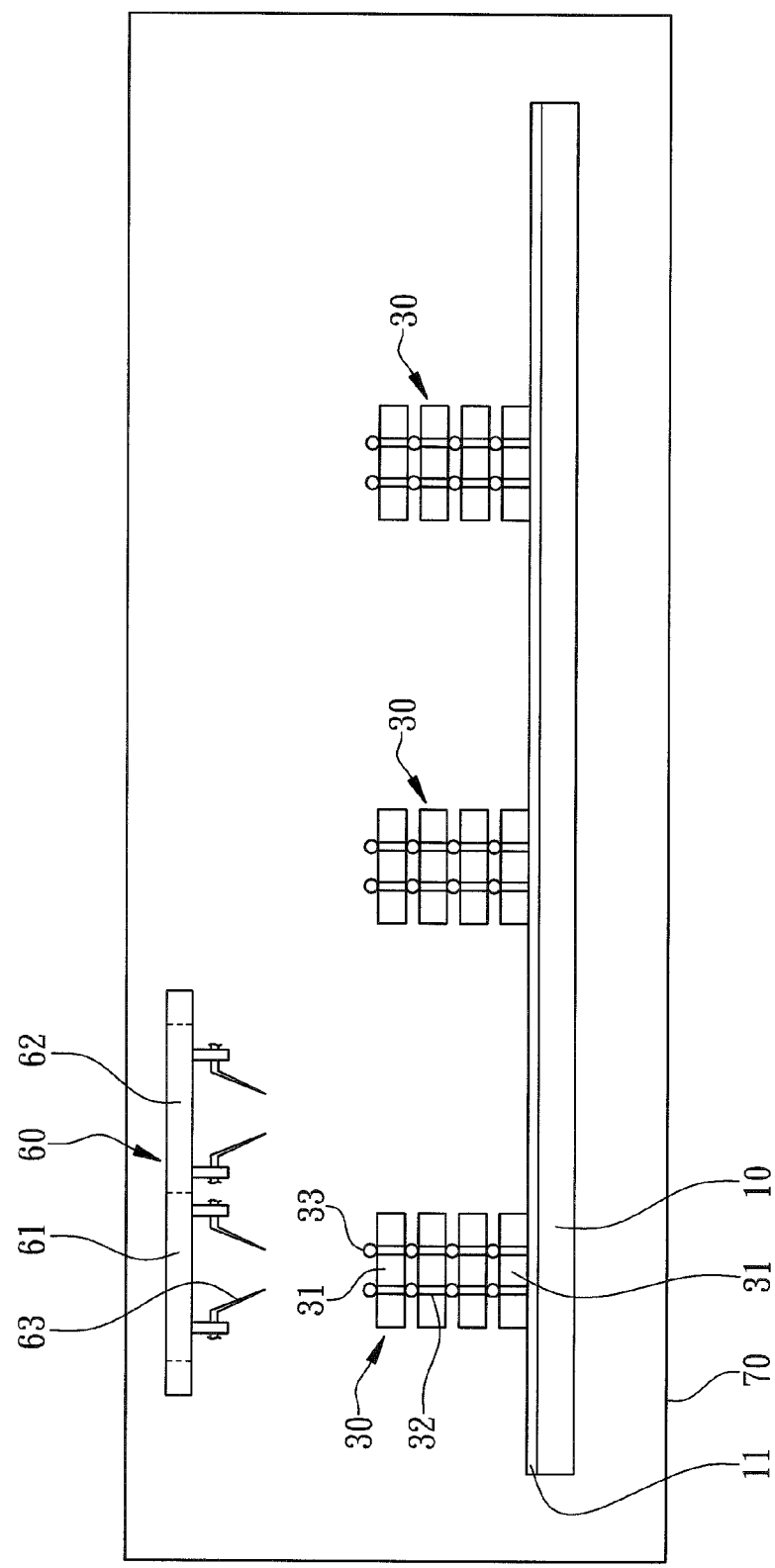
Figure 1G:
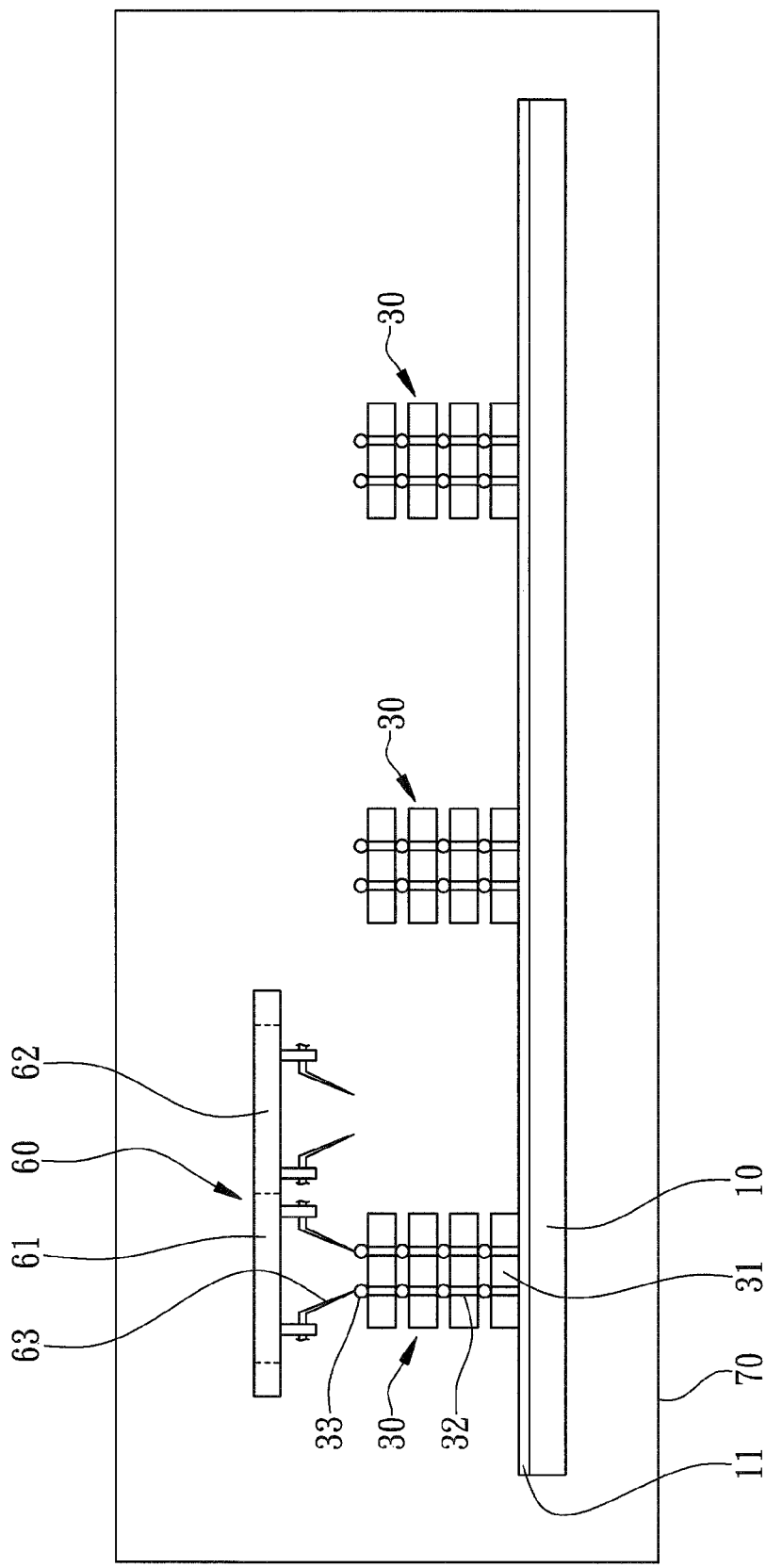

Finally, as shown in FIG. 1F and FIG. 1G, a second wafer-level testing is proceeded in the wafer tester 70 where the carrier wafer 10 is loaded into the wafer tester 70. The second wafer-level testing step including the sub-step of probing the second 3D-stacked chip cubes 30 in each second probe card activated region 51 by the probe card 60. Most of the component probing units 61 of the probe card 60 are aligned to the corresponding second 3D-stacked chip cubes 30 where the prone-to-overkill component probing units 62 are not aligned to any of the second 3D-stacked chip cubes 30 left to be empty. Moreover, the probes 63 of the probe card 60 are electrically contacted to the second micro joints 33 of the corresponding second 3D-stacked chip cubes 30. Then, the carrier wafer 10 is radiated by UV light after unloading from the wafer tester 70 to reduce the adhesion of the temporary adhesive layer 11 so that the second 3D-stacked chip cubes can easily be picked, placed and sorted.

Figure 9:
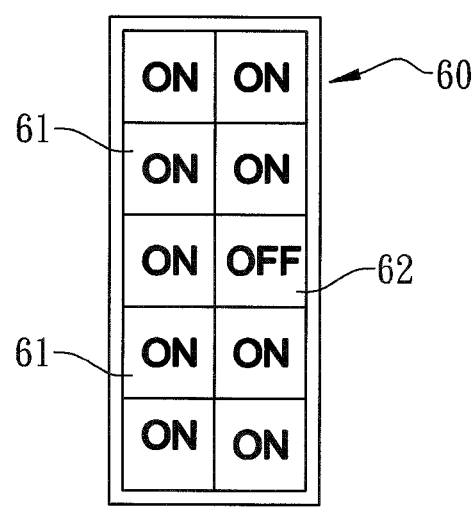
FIG. 9 is an ON-OFF distribution of the probe card of a tester during the second wafer-level testing of the wafer-level testing method for singulated 3D-stacked chip cubes according to the preferred embodiment of the present invention.

Preferably, as shown in FIG. 9, during the second wafer-level testing, most of the electrical functions of the component probing units 61 of the probe card 60 aligned with the corresponding second component-attaching regions 52 in the second probe card activated regions 51 are partially activated. The component probing units 61 of the probe card 60 marked with "ON" in FIG. 9 are electrically activated where one or more of the component probing units 61 of the probe card 60 marked with "OFF" are electrically deactivated which are corresponding to the prone-to-overkill component-attaching regions 44.

Therefore, according to the wafer-level testing method for singulated 3D-stacked chip cubes of the present invention, there is no second 3D-stacked chip cubes disposed at the above mentioned prone-to-overkill component-attaching regions during the second wafer-level testing step to avoid overkill issues and to deactivate electrical functions of the prone-to-overkill component probing units of a probe card in a preferred operation mode leading to greatly reduce the electrical testing time of the prone-to-overkill component-attaching regions to further improve the testing efficiency of the wafer-level testing of 3D-stacked chip cubes. The wafer-level testing method for testing the singulated 3D-stacked chip cubes according to the present invention has the following advantages. There is no frequent manually adjustment of the wafer tester during wafer-level testing so that the testing of 3D-stacked chip cubes can smoothly and continuously run with manufacturing output priority until regular maintenance is due or the number of the prone-to-overkill component probing units has reached the upper limit to further reduce the repair time of testers. Furthermore, after the repair of the wafer tester or its probe card, the prone-to-overkill component probing units of the probe card can be adjusted and fixed so that the second wafer map can be reassigned as the first wafer map to achieve maximum productivity. When prone-to-overkill component probing units with fixed locations begin to show up and accumulate during wafer-level testing, then the first wafer map can be adjusted and modified to be the second wafer map.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A wafer-level testing method for testing a plurality of singulated 3D-stacked chip cubes comprising the steps of:

providing a carrier wafer with the same dimension as a semiconductor wafer for loading in a wafer tester;

attaching a plurality of first 3D-stacked chip cubes onto the carrier wafer according to a first wafer map, wherein the first wafer map defines a plurality of first probe card activated regions, each being corresponding to a probe card in the wafer tester and including a plurality of first component-attaching regions to constitute a M-by-N matrix, wherein each first component-attaching region is one-to-one corresponding to one of the first 3D-stacked chip cubes on the carrier wafer and is one-to-one corresponding to one of a plurality of component probing units of the probe card;

proceeding a first wafer-level testing in the wafer tester, including probing the first 3D-stacked chip cubes disposed in each corresponding first probe card activated region by the probe card whereas the electrical functions of the component probing units of the probe card are fully activated;

building a second wafer map according to the testing results of the first wafer-level testing to confirm one or more prone-to-overkill component-attaching regions in each first probe card activated region, wherein the second wafer map defines a plurality of second probe card activated regions, each being corresponding to the probe card and including a plurality of second component-attaching regions arranged in a same pattern to constitute an incomplete matrix by excluding the above mentioned prone-to-overkill component-attaching regions;

attaching a plurality of second 3D-stacked chip cubes with the same dimension as the first 3D-stacked chip cubes on the carrier wafer according to the second wafer map whereas the second 3D-stacked chip cubes are not disposed in the corresponding prone-to-overkill component-attaching regions; and proceeding a second wafer-level testing in the wafer tester, including probing the second 3D-stacked chip cubes in each corresponding second probe card activated region by the probe card.

2. The wafer-level testing method as claimed in claim 1, wherein the electrical functions of the component probing units of the probe card are partially activated and the electrical functions of one or more of the component probing units corresponding to the above mentioned prone-to-overkill component-attaching regions are deactivated during the second wafer-level testing step.

3. The wafer-level testing method as claimed in claim 1, wherein at least one row of first non-probing regions are reserved between the first probe card activated regions according to the first wafer map, wherein the unit dimension of the first non-probing regions has the same dimension as the unit dimension of the first component-attaching regions.

4. The wafer-level testing method as claimed in claim 3, wherein at least one row of second non-probing regions are reserved between the second probe card activated regions according to the second wafer map, wherein the unit dimension of the second non-probing regions has the same dimension as the unit dimension of the second component-attaching regions.

5. The wafer-level testing method as claimed in claim 1, wherein each first 3D-stacked chip cube consists of a plurality of known good dice and each second 3D-stacked chip cube consists of a plurality of untested dice.

* * * * *